United States Patent
Lin

(10) Patent No.: US 9,236,431 B2
(45) Date of Patent: Jan. 12, 2016

(54) SEMICONDUCTOR DEVICE AND TERMINATION REGION STRUCTURE THEREOF

(71) Applicant: ECONOMIC SEMICONDUCTOR CORPORATION, Taoyuan County (TW)

(72) Inventor: Wen-Bin Lin, New Taipei (TW)

(73) Assignee: ECONOMIC SEMICONDUCTOR CORPORATION, New Taipei (TW)

( * ) Notice: Subject to any disclaimer, the term of this patent is extended or adjusted under 35 U.S.C. 154(b) by 0 days.

(21) Appl. No.: 14/256,349

(22) Filed: Apr. 18, 2014

(65) Prior Publication Data

US 2014/0312452 A1   Oct. 23, 2014

(30) Foreign Application Priority Data

Apr. 19, 2013   (TW) .............................. 102113858 A

(51) Int. Cl.
  *H01L 29/872*   (2006.01)
  *H01L 29/06*    (2006.01)
  *H01L 29/66*    (2006.01)

(52) U.S. Cl.
  CPC ...... *H01L 29/0661* (2013.01); *H01L 29/66143* (2013.01); *H01L 29/8725* (2013.01)

(58) Field of Classification Search
  CPC .................... H01L 29/0661; H01L 29/66143; H01L 29/8725
  See application file for complete search history.

(56) References Cited

U.S. PATENT DOCUMENTS

| | | | |
|---|---|---|---|
| 7,586,151 B2 * | 9/2009 | Takaya et al. ................ | 257/330 |
| 7,943,990 B2 * | 5/2011 | Ma et al. ...................... | 257/330 |
| 2003/0001215 A1 * | 1/2003 | Wahl et al. ................... | 257/401 |
| 2004/0021195 A1 * | 2/2004 | Kurosaki et al. ............. | 257/506 |
| 2004/0232522 A1 * | 11/2004 | Shimizu ....................... | 257/548 |
| 2005/0145936 A1 * | 7/2005 | Polzl et al. ................... | 257/341 |
| 2008/0012050 A1 * | 1/2008 | Aoki et al. ................... | 257/262 |
| 2008/0251810 A1 * | 10/2008 | Torii ............................. | 257/139 |
| 2009/0108344 A1 * | 4/2009 | Kumekawa et al. ......... | 257/330 |
| 2010/0078774 A1 * | 4/2010 | Hirler .......................... | 257/652 |
| 2010/0155879 A1 * | 6/2010 | Schulze et al. ............... | 257/503 |
| 2010/0327288 A1 | 12/2010 | Chao et al. | |
| 2011/0169075 A1 * | 7/2011 | Hsieh .......................... | 257/330 |
| 2012/0319215 A1 * | 12/2012 | Wang et al. .................. | 257/410 |
| 2013/0181319 A1 * | 7/2013 | Huang et al. ................. | 257/471 |
| 2014/0217497 A1 * | 8/2014 | Kawahara et al. ........... | 257/330 |

\* cited by examiner

*Primary Examiner* — Michele Fan
(74) *Attorney, Agent, or Firm* — Koppel, Patrick, Heybl & Philpott

(57) ABSTRACT

A termination region structure of a semiconductor device is provided, which includes: a semiconductor layer; a plurality of trenches, formed on a surface of the semiconductor layer; a connecting trench, formed on the surface of the semiconductor layer, for connecting two adjacent trenches in the plurality of trenches; a first insulating layer, formed on surfaces of the plurality of trenches, the connecting trench, and the semiconductor layer; a conductive material, formed in the plurality of trenches and the connecting trench; a second insulating layer, covering part of a surface of the first insulating layer and part of a surface of the conductive material; and a metal layer, covering part of a surface of the second insulating layer.

4 Claims, 19 Drawing Sheets

SEMICONDUCTOR DEVICE AND TERMINATION REGION STRUCTURE THEREOF

BACKGROUND

1. Technical Field

The present invention relates to a semiconductor device and a termination region structure thereof, and particularly to a semiconductor device having a trench structure and a termination region structure thereof.

2. Related Art

A Schottky diode is a semiconductor device formed by a metal-semiconductor junction, and due to its low turn-on voltage and high respond speed, it is widely used in various electronic circuits such as power conversion circuits at present. The conventional Schottky diode structure includes a heavily doped semiconductor substrate, which is usually made of monocrystalline silicon; and a semiconductor layer served as a cathode region, which is made of a material doped with a low concentration of the carrier having conductivity identical to that of the substrate. Moreover, a metal layer or a metal silicide layer is formed on the cathode region lightly doped, so as to form a Schottky barrier and constitute an anode of the diode.

The Schottky diode has a characteristic of fast speed, and only requires a low forward bias; in other words, the Schottky diode may have a large forward current and short reverse recovery time. However, when a reverse bias continues to increase, there will be a large leakage current (depending on the work function of the metal and the doping concentration of the semiconductor). Therefore, a trench Schottky diode in the prior art pinches off a reverse leakage current by filling polysilicon or metal in the trenches.

For the conventional trench Schottky diode, reference can be made to U.S. published patent application No. US 2010/0327288. FIG. 1(a) illustrates a trench Schottky diode device according to the application, which includes: a semiconductor substrate 12 having a multi-trench structure 11; a first mask layer 13, formed on a surface of the semiconductor substrate 12; a gate oxide layer 14, formed on a surface of the multi-trench structure 11, where the gate oxide layer 14 protrudes from the surface of the semiconductor substrate 12; a polysilicon structure 15, formed on the gate oxide layer 14, where the polysilicon structure 15 protrudes from the surface of the semiconductor substrate 12; a second mask layer 16, formed on the first mask layer 13 and part of the polysilicon structure 15; and a metal sputtering layer 17, formed on part of surfaces of the second mask layer 16, the semiconductor substrate 12, the polysilicon structure 15 and the gate oxide layer 14.

In addition, a manufacturing process of the trench Schottky diode in FIG. 1(a) includes the following steps: providing a semiconductor substrate (12); forming a first mask layer (13) on the semiconductor substrate (12); etching the semiconductor substrate (12) according to the first mask layer (13), so as to form a multi-trench structure (11) in the semiconductor substrate (12); forming a gate oxide layer (14) on a surface of the multi-trench structure (11); forming a polysilicon structure (15) on the gate oxide layer (14) and the first mask layer (13); etching the polysilicon structure (15), so as to expose a top surface and part of side surfaces of the first mask layer (13); forming a second mask layer (16) on part of the polysilicon structure (15) and part of the first mask layer (13), so as to expose part of surfaces of the semiconductor substrate (12), the polysilicon structure (15) and the gate oxide layer (14); forming a metal sputtering layer (17) on the second mask layer (16) and part of the surfaces of the semiconductor substrate (12), the polysilicon structure (15) and the gate oxide layer (14); and etching the metal sputtering layer (17), so as to expose part of a surface of the second mask layer (16).

However, in the termination region of the conventional trench Schottky diode, polysilicon in a plurality of trenches is not electrically connected to the metal layer, so that the plurality of trenches is in a floating potential state when the device is operated in a reverse bias. The electric field distribution of the termination region cannot be extended and dispersed, resulting in strong electric field crowding, and the breakdown voltage cannot be effectively improved. Accordingly, there are still restrictions on applications thereof for semiconductor devices with higher power or voltage, and how to design and manufacture a Schottky diode with a high breakdown voltage and a low reverse leakage current becomes an urgent issue needs to be solved.

SUMMARY

In view of the shortcomings of the prior art, the present invention proposes a connecting trench structure, which may be widely applied to trench-type semiconductor devices. By connecting one or more parts of adjacent trenches in a plurality of trenches, electric field distribution in a semiconductor device changes accordingly, and thus current-voltage characteristics thereof can be improved. Similarly, characteristics of the semiconductor device may be adjusted by further changing configuration of the connecting trench, so as to be applied to various application demands.

In one aspect of the present invention, a termination region structure of a semiconductor device is provided, which includes: a semiconductor layer; a plurality of trenches, formed on a surface of the semiconductor layer; a first connecting trench, formed on the surface of the semiconductor layer, for connecting a first trench and a second trench adjacent to each other in the plurality of trenches; a first insulating layer, formed on a surface of the plurality of trenches, a surface of the connecting trench, and the surface of the semiconductor layer where the plurality of trenches or the connecting trench is not formed; a conductive material (for example, polysilicon or tungsten), formed and filled in the plurality of trenches and the first connecting trench whose surfaces have the first insulating layer, where the conductive material filled in the first trench and the second trench may be connected through the conductive material filled in the first connecting trench; a second insulating layer at least covering part of a surface of the first insulating layer not contacting the conductive material and part of a surface of the conductive material not contacting the first insulating layer; and a metal layer, at least covering part of a surface of the second insulating layer. In the first trench, the second insulating layer may cover part of the surface of the conductive material not contacting the first insulating layer, and the metal layer covers the other part of the surface of the conductive material not contacting the first insulating layer; the other part of the surface of the conductive material covered by the metal layer may be further provided with a metal silicide layer or a Schottky metal layer. The first connecting trench may be further configured to be perpendicular to the first trench and the second trench, or perpendicular to a tangent of the first trench and a tangent of the second trench. The termination region structure of a semiconductor device may further include a second connecting trench for connecting the second trench and a third trench in the plurality of trenches, the third trench is adjacent to the second trench; where the second connecting trench and the first connecting trench may be staggered, that is, they are non-collinear. The second connecting trench in the termination region structure of a semiconductor device may also be used for connecting a third trench and a fourth trench adjacent to each other in the plurality of trenches, and at this time, the first connecting trench and the second connecting trench are not connected. The termination region structure of a semiconductor device may be applied to different types of semiconductor devices, such as, a Schottky diode, a metal oxide semiconductor field effect transistor, a bipolar junction transistor, or an insulated gate bipolar transistor.

In another aspect of the present invention, a semiconductor device is provided, which has an active region and a termination region, and includes: a semiconductor layer; a plurality of trenches, formed on a surface of the semiconductor layer; a connecting trench, formed on the surface of the semiconductor layer and located in the termination region, for connecting two adjacent trenches in the plurality of trenches; a first insulating layer, formed on part of surfaces of the plurality of trenches and the connecting trench in the active region, where an upper edge thereof is lower than the surface of the semiconductor layer where no trenches are formed, and formed on the surface of the plurality of trenches, the surface of the connecting trench, and the surface of the semiconductor layer where the plurality of trenches or the connecting trench is not formed in the termination region; a conductive material, formed in the plurality of trenches and the connecting trench, and completely covering the first insulating layer in the bottom of the plurality of trenches and in the bottom of the first connecting trench; a second insulating layer, at least covering part of a surface of the first insulating layer not contacting the conductive material and part of a surface of the conductive material not contacting the first insulating layer in the termination region; and a metal layer, at least covering the active region and part of a surface of the second insulating layer.

In still another aspect of the present invention, a Schottky diode is provided, which has an active region and a termination region, and includes: a semiconductor layer; a plurality of trenches, formed on a surface of the semiconductor layer; a connecting trench, formed on the surface of the semiconductor layer and located in the termination region, for connecting a first trench and a second trench adjacent to each other in the plurality of trenches; a first insulating layer, formed on at least part of a surface of the plurality of trenches, at least part of a surface of the connecting trench, and the surface of the semiconductor layer where the plurality of trenches or the connecting trench is not formed in the termination region; a conductive material (for example, polysilicon or tungsten), formed in the plurality of trenches and the first connecting trench whose surfaces have the first insulating layer, where the conductive material filled in the first trench and the second trench may be connected through the conductive material filled in the first connecting trench; a second insulating layer, at least covering part of a surface of the first insulating layer not contacting the conductive material and part of a surface of the conductive material not contacting the first insulating layer in the termination region; and a metal layer, at least covering the active region and part of a surface of the second insulating layer. In the first trench, the second insulating layer may cover part of the surface of the conductive material not contacting the first insulating layer, and the metal layer covers the other part of the surface of the conductive material not contacting the first insulating layer. In addition, in the active region, surfaces of the semiconductor layer and the conductive material not contacting the first insulating layer may be further provided with a metal silicide layer or a Schottky metal layer.

In yet another aspect of the present invention, a method for manufacturing a Schottky diode is provided, which includes the following steps: (1) forming a trench structure on a semiconductor layer, where the trench structure includes a plurality of trenches and a plurality of connecting trenches connecting two adjacent trenches in the plurality of trenches; (2) forming a first insulating layer, where the first insulating layer covers a surface of the trench structure and a surface of the semiconductor layer where the trench structure is not formed; (3) forming a conductive material in the trench structure covered by the first insulating layer, so as to fill the trench structure; (4) forming a second insulating layer, for covering a surface of the first insulating layer not contacting the conductive material and a surface of the conductive material not contacting the first insulating layer; (5) removing part of the second and first insulating layers, to expose an upper edge of the conductive material and the surface of the semiconductor layer where no trench regions are formed; (6) forming a metal silicide layer or a Schottky metal layer at least on the exposed upper edge of the conductive material and the exposed surface of the semiconductor layer where no trench regions are formed; (7) forming a first metal layer, to cover a region where part of the second and first insulating layers are removed and part of the second insulating layer; and (8) forming a protective layer, to cover part of the first metal layer and part of the second insulating layer. The step of forming a trench structure may further include: (1A) forming a hard mask layer on the semiconductor layer; (1B) patterning the hard mask layer, to expose part of the semiconductor layer where the trench structure is to be formed; (1C) forming the trench structure through dry etch in regions not covered by the hard mask layer; and (1D) removing the patterned hard mask layer. The step of patterning the hard mask layer may further include using photo lithography, dry etch or other manners. The step of forming the first insulating layer may include forming a silicon dioxide layer through thermal oxidation or chemical vapor deposition. The step of forming the conductive material may further include: (3A) depositing the polysilicon through chemical vapor deposition, so that the polysilicon covers the first insulating layer and fills the trench structure whose surface has the first insulating layer; and (3B) removing part of the polysilicon through dry etch, to expose an upper edge of the first insulating layer and an upper edge of the polysilicon filling the trench structure; where after part of the second and first insulating layers are removed, the upper edge of the first insulating layer in the trenches in the active region may be lower than the surface of the semiconductor layer where no trenches are formed. The step of forming a metal silicide layer on the exposed upper edge of the conductive material and the exposed surface of the semiconductor layer where no trench regions are formed may include: (6A) forming a second metal layer in a region where part of the second and first insulating layers are removed; (6B) making an upper edge of the conductive material and the surface of the semiconductor layer where no trench regions are formed react with the second metal layer through thermal annealing, so as to form the metal silicide layer; and (6C) removing the second metal layer. In the method for manufacturing a Schottky diode, the upper edge of the first insulating layer in the trench in the region where part of the second insulating layer and part of the first insulating layer are removed may be lower than the surface of the semiconductor layer where a trench portion is not formed; in addition, after part of the first insulating layer and part of the second insulating layer are removed in step (5), borders of the first insulating layer and the second insulating layer that are not removed may be located on an upper edge of the conductive material in a trench of the plurality of trenches.

Based on the above intention of the present invention, by adding a termination region structure of a connecting trench a semiconductor device may have a higher breakdown voltage than that in the prior art. Exemplary embodiments of the present invention are described later.

DETAILED DESCRIPTION

Figure 1:
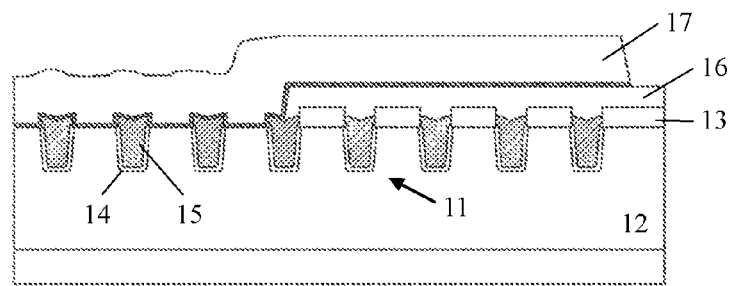
FIG. 1(a) is a schematic cross-sectional view of a conventional trench-type Schottky diode.
FIG. 1(b) is a schematic top view of part of a trench structure.
Figure 1:
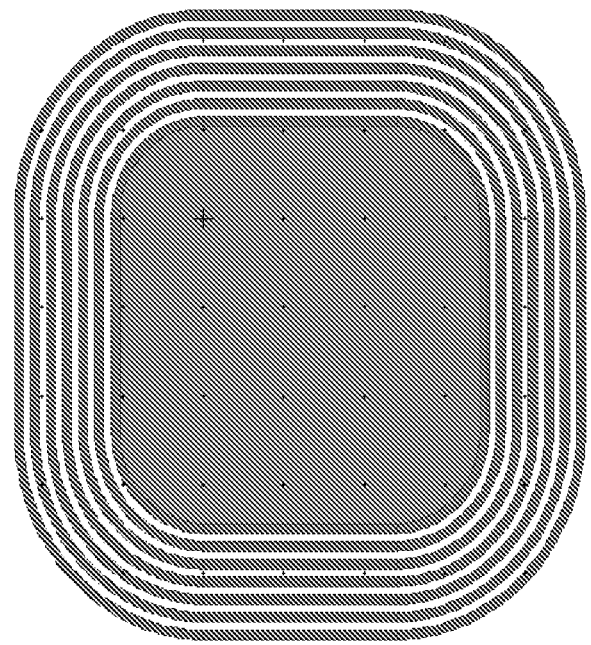

Examples of embodiments of the present invention are described below with reference to the accompanying drawings on the basis of the foregoing inventive intention. Component structures disclosed in the drawings are only for illustrative purpose, which neither represent the size or scale of the actual structures, nor limit all compositions of actual components.

Figure 2:
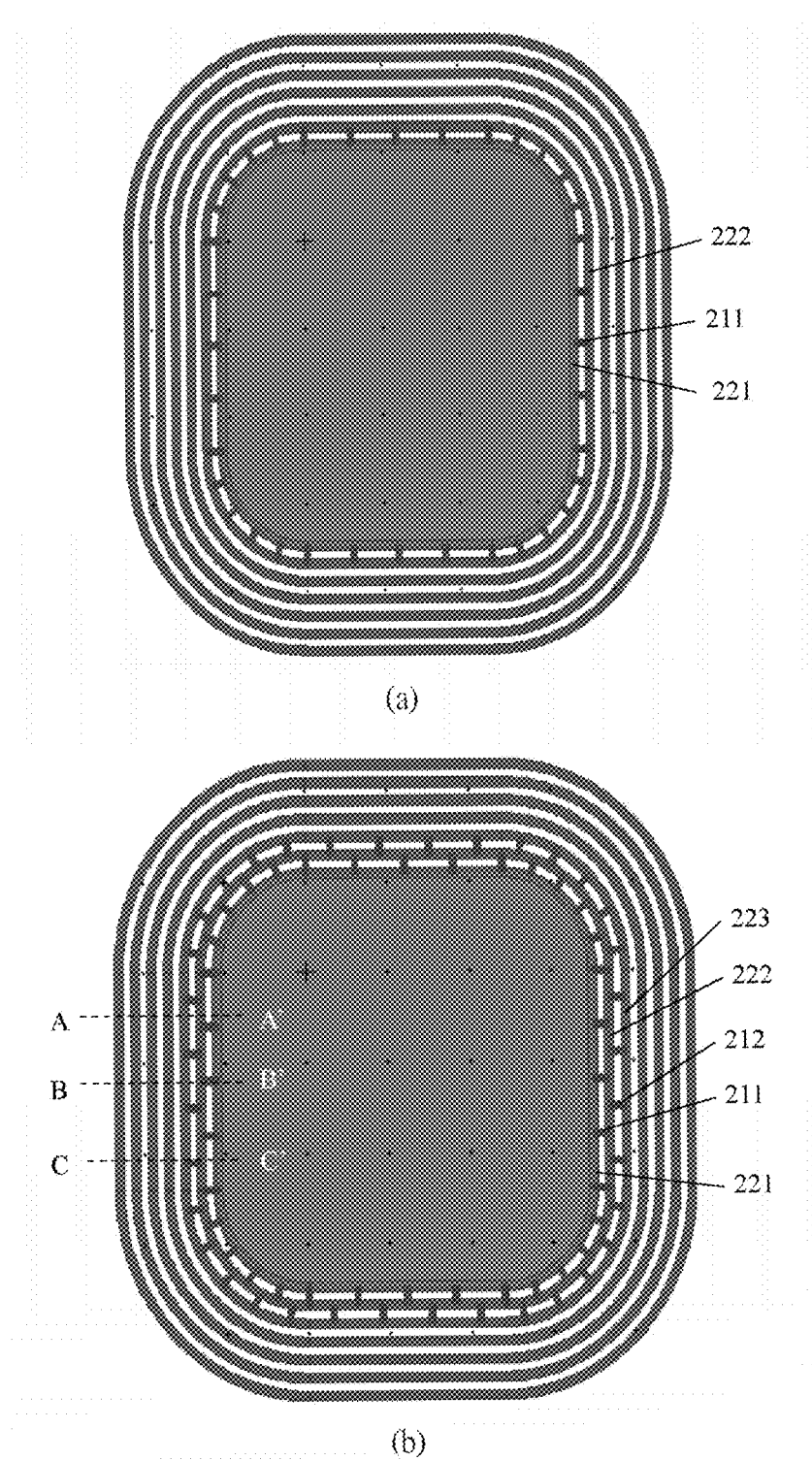
FIGS. 2(a)-(d) are schematic top views of part of trenches and connecting trenches of a Schottky diode according to the present invention.
Figure 2:
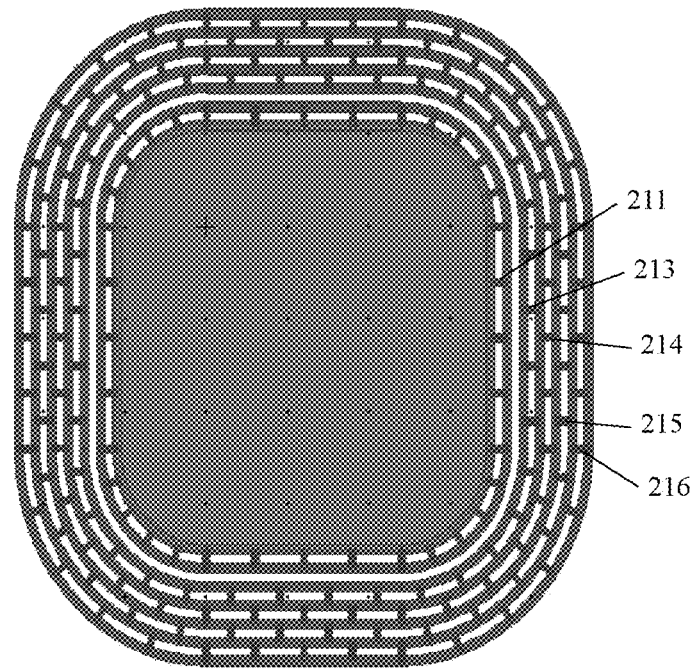
Figure 2:
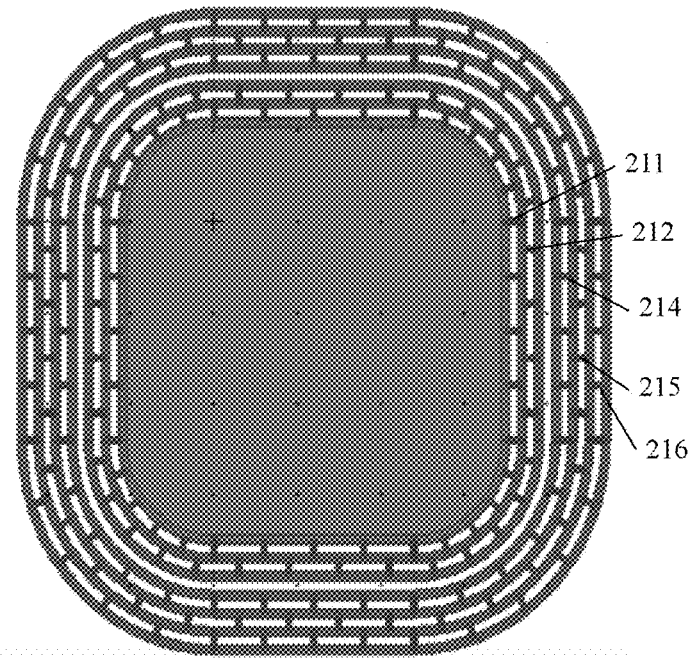

Corresponding to the termination structure of the conventional trench Schottky diode in FIG. 1(a), FIG. 1(b) is equivalent to a top view of the trenches in a termination region thereof, which may also be understood as part of a photo mask pattern used in the process of manufacturing a semiconductor device. One embodiment of the present invention is a termination region of a semiconductor device having a connecting trench, the connecting trench is used to connect some trenches in the conventional trench-type semiconductor device, and top views of the termination region portion may be as those shown in FIGS. 2(a)-(d). Similarly, FIGS. 2(a)-(d) may also be understood as a photo mask pattern of a trench portion; FIGS. 2(a)-(d) are different from FIG. 1(b) in that FIGS. 2(a)-(d) additionally have connecting trenches with different arrangements, and the devices corresponding to the drawings respectively may have different voltage-current characteristics along with the different arrangements of the connecting trenches. For the device corresponding to FIG. 2(a), a plurality of connecting trenches 211 thereof is used for connecting a trench 221 and a trench 222 on the innermost side of the termination region. After each trench and the connecting trenches are filled with a conductive material, potentials of the conductive materials in the trenches 221 and 222 and the connecting trenches 211 will be the same. However, the connecting trenches may also be configured to continue extending outwards. As shown by the pattern in FIG. 2(b), a plurality of connecting trenches 212 is further included for connecting the trench 222 and a trench 223, wherein the connecting trenches 211 and the connecting trenches 212 may be arranged collinearly or staggered as shown in FIG. 2(b), and their different relative positions correspondingly generate different electric field distribution in the semiconductor device, that is, different current-voltage curves. In addition, the connecting trenches may also adopt partition arrangement as shown in FIG. 2(c). FIG. 2(c), in addition to having a plurality of connecting trenches 211 equivalent to FIG. 2(a) for connecting two trenches on the innermost side, a plurality of connecting trenches 213, 214, 215, and 216 is further included for connecting five trenches on an outermost side. FIG. 2(d) is on the basis of FIG. 2(b), which further sets a plurality of connecting trenches 214, 215, and 216, for connecting four trenches on an outermost side. In other words, the structures disclosed in FIGS. 2(c) and (d) have two groups of trenches, and the trenches in the same group are mutually connected, while the trenches in different groups are isolated. In other words, after the conductive material is filled, the trenches in the same group have equal potentials. Based on the same concept, more groups of trenches may be designed.

The so-called "connect" herein, for the meaning of trench structure manufacturing, means that two or more trenches are connected and in communication with each other; after the trenches are filled with the conductive material, the effect thereof is electrical connection. However, the type or size of the connecting trenches 211-216 is not limited to those illustrated in FIGS. 2(a)-(d), and persons of ordinary skill in the art may select the appropriate type and size according to requirements of component efficiency or process condition restrictions. For example, the connecting trenches in FIGS. 2(a)-(d) are all perpendicular to the plurality of trenches, or perpendicular to tangents at bends of the plurality of trenches; however, this is only illustrative of the present invention, but is not intended to limit structural features of the connecting trenches. On the other hand, connection between the trenches is not limited to use of the connecting trenches, for example, in the conventional structure of FIG. 1(a), an opening may be formed in the second mask layer 16, and the metal sputtering layer 17 fills the opening, so that the polysilicon structures 15 in part of the trenches may be connected through the metal sputtering layer 17. For persons of ordinary skill in the field of semiconductor devices, the connecting trenches in the present invention may be applied to a variety of semiconductor devices having termination regions with trenches, such as, a Schottky diode, a metal oxide semiconductor field effect transistor (MOSFET), a bipolar junction transistor (BJT), an insulated gate bipolar transistor (IGBT).

Figure 3:
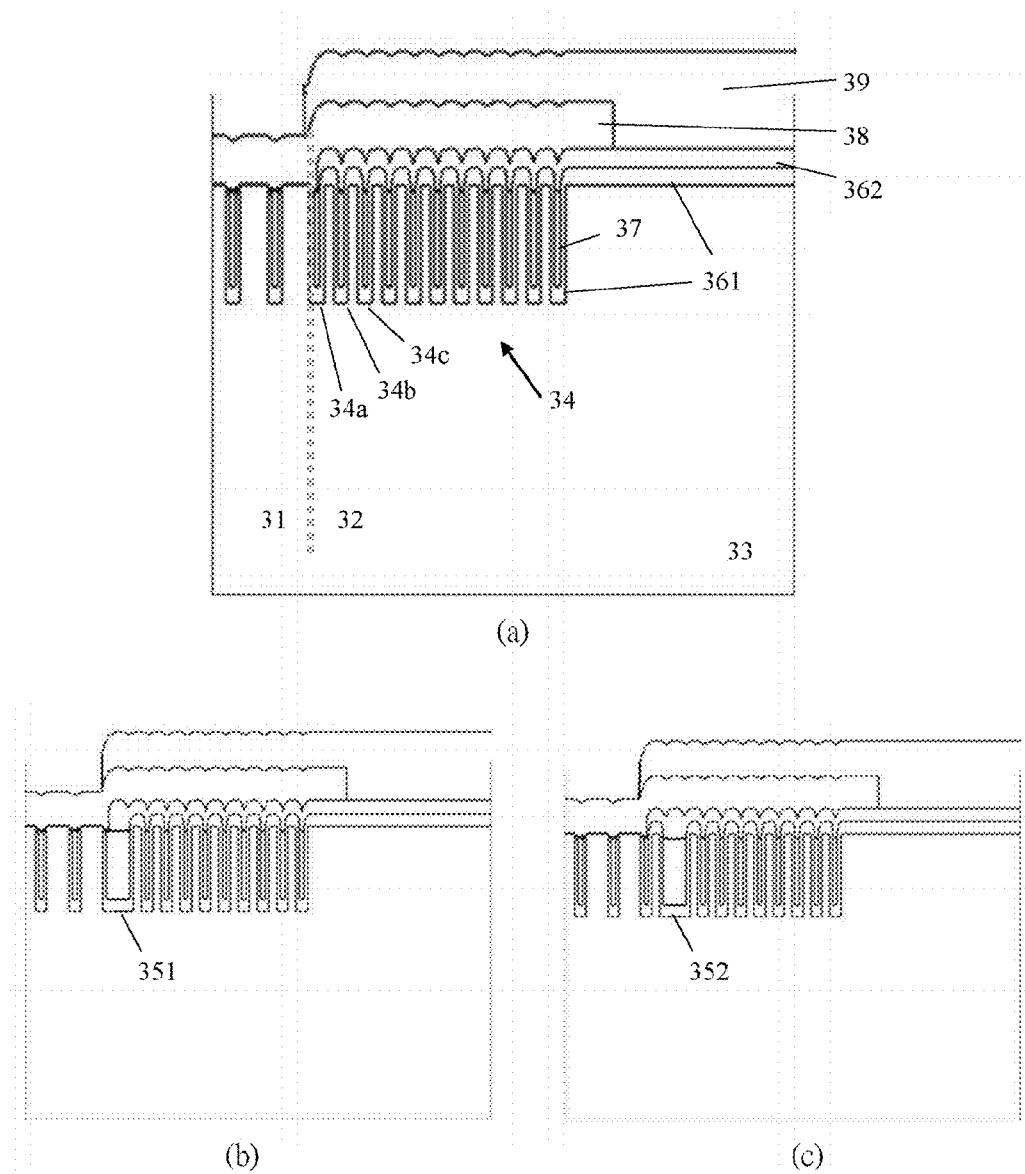
FIGS. 3(a)-(c) are schematic cross-sectional views of different positions of a Schottky diode according to the present invention.

By using the trench structure shown in FIG. 2(b) as an example, FIG. 3 discloses a cross-sectional structure of a Schottky diode corresponding thereto. First, FIG. 3(a) is equivalent to a cross-sectional structure along a segment A-A' in FIG. 2(b), and because of the position of the segment A-A', the trench portion shown in FIG. 3(a) is similar to the conventional structure (see FIG. 1(a)). However, FIG. 3(b) and FIG. 3(c) are respectively equivalent to cross-sectional structures along a segment B-B' and a segment C-C' in FIG. 2(b). It is obvious from FIG. 3(b) that the connecting trenches connect the trenches 221 and 222 along the segment B-B', and it is also obvious from FIG. 3(b) that the connecting trenches connect 222 and 223 along the segment B-B'.

Figure 6:
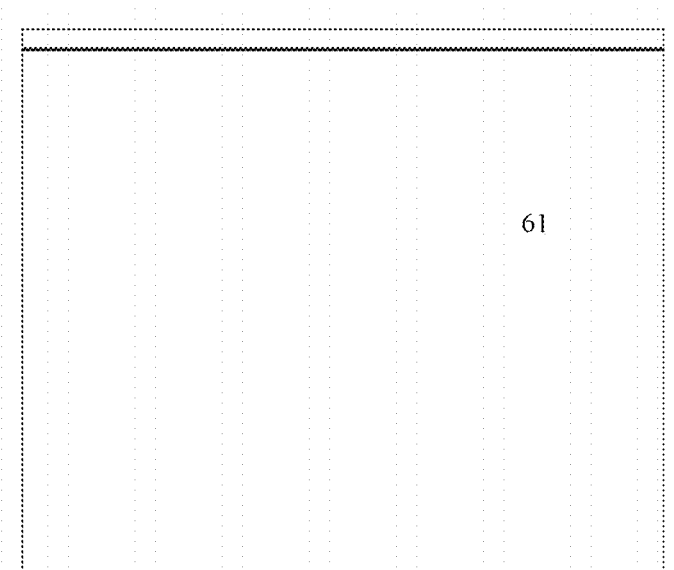
FIGS. 6(a)-(z) are schematic views of a manufacturing process of a Schottky diode according to the present invention.
Figure 6:
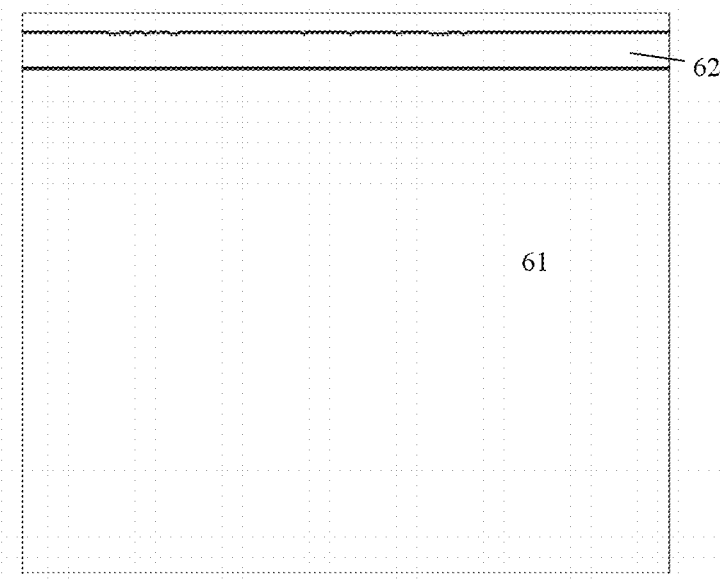
Figure 6:
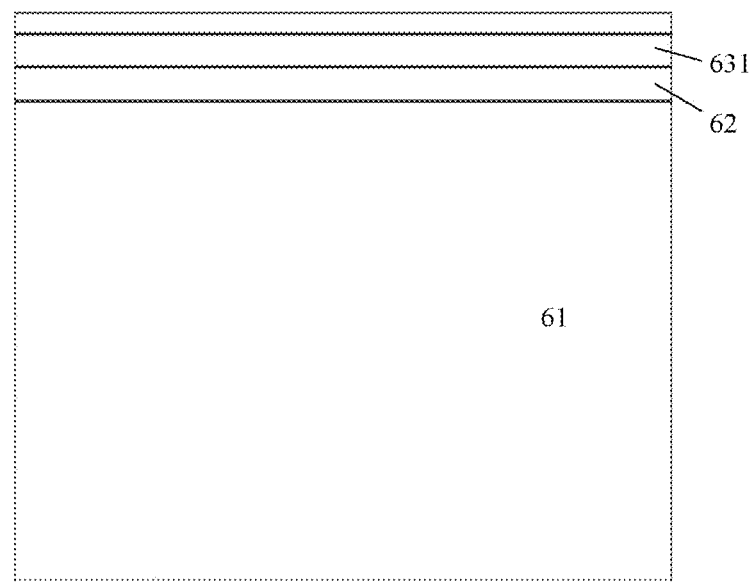
Figure 6:
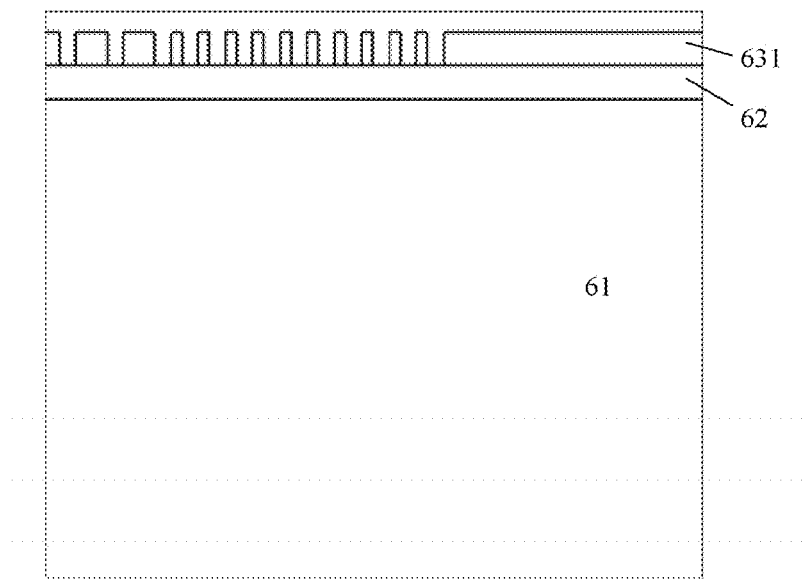
Figure 6:
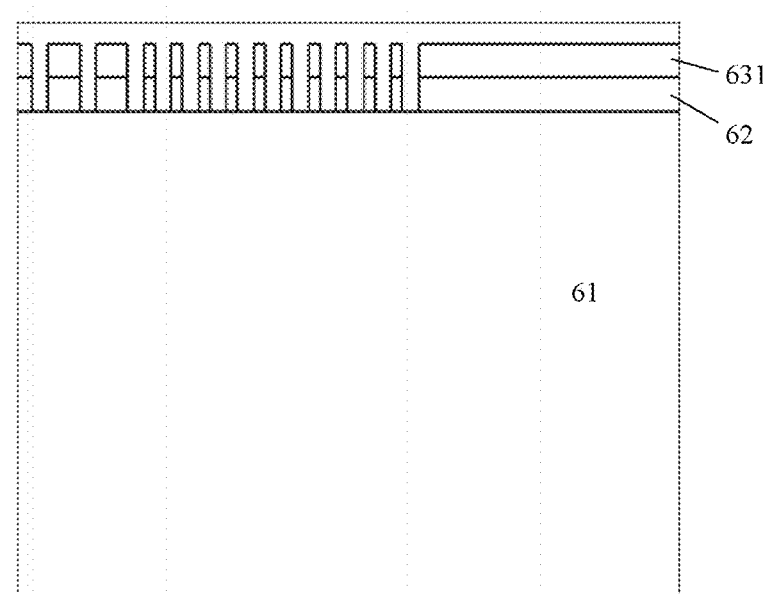
Figure 6:
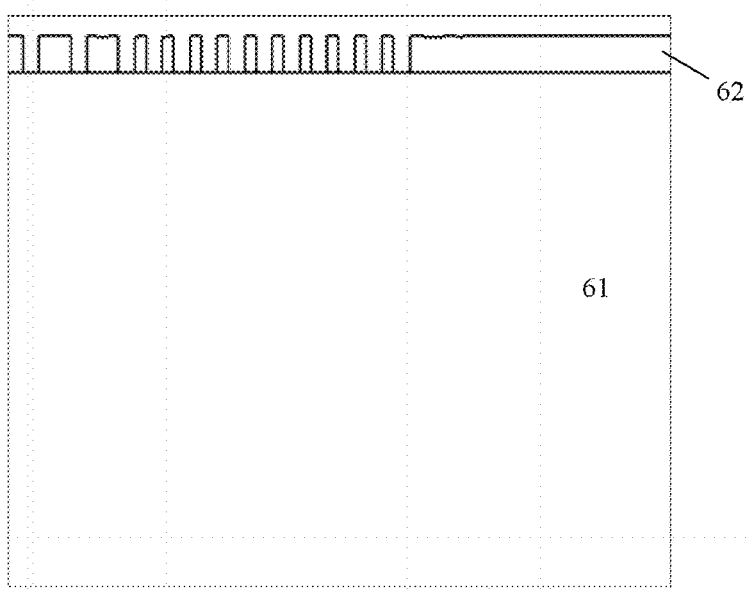
Figure 6:
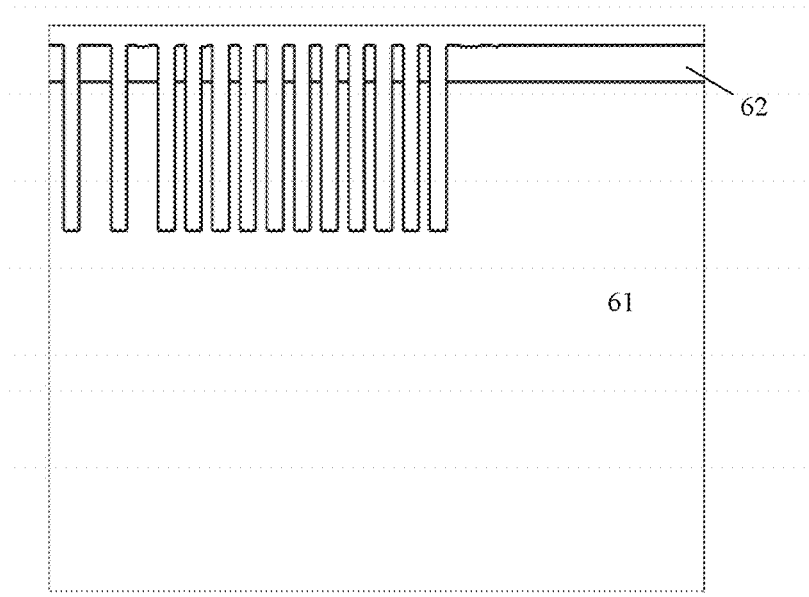
Figure 6:
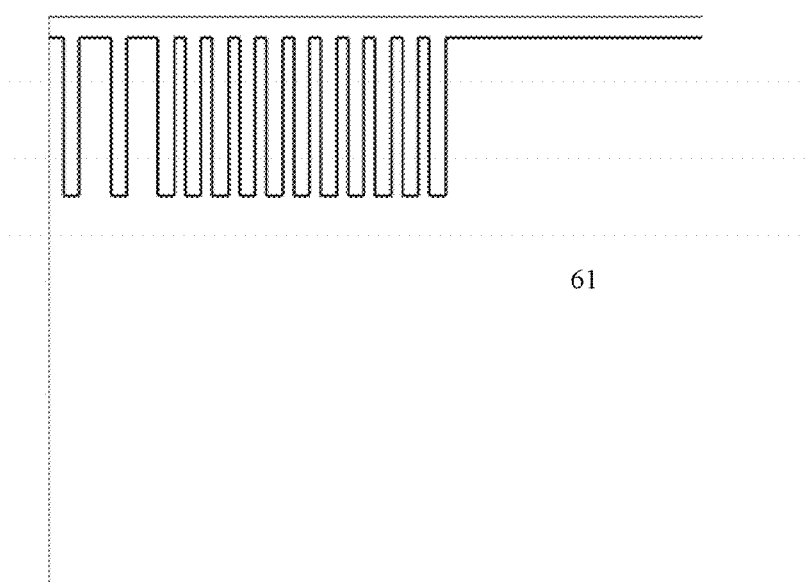
Figure 6:
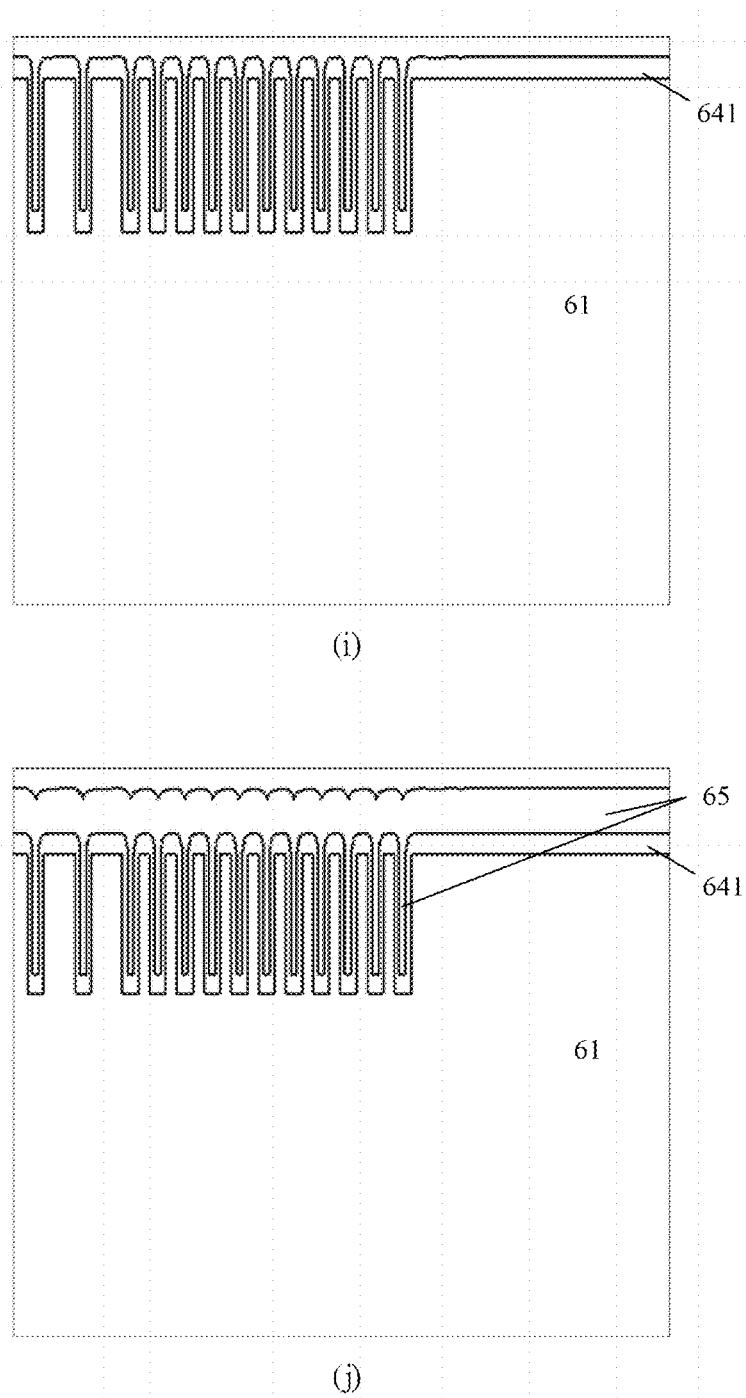
Figure 6:
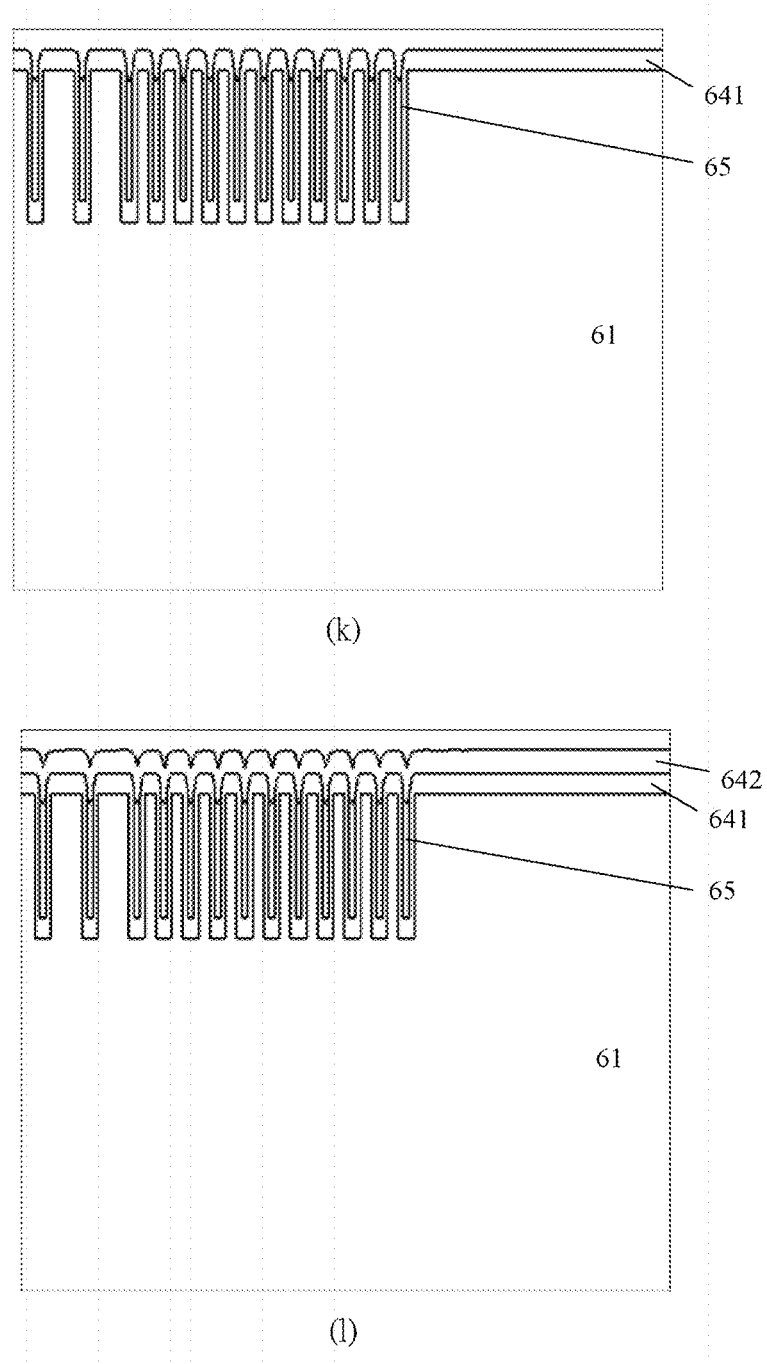
Figure 6:
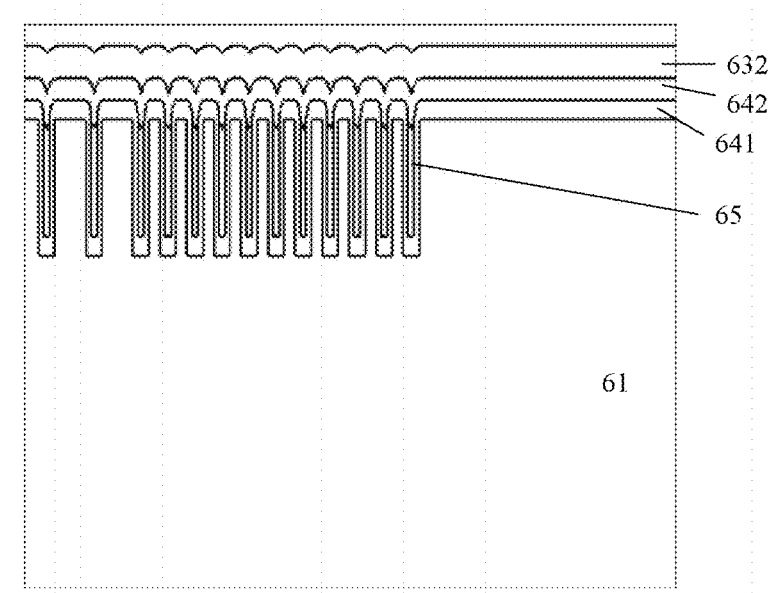
Figure 6:
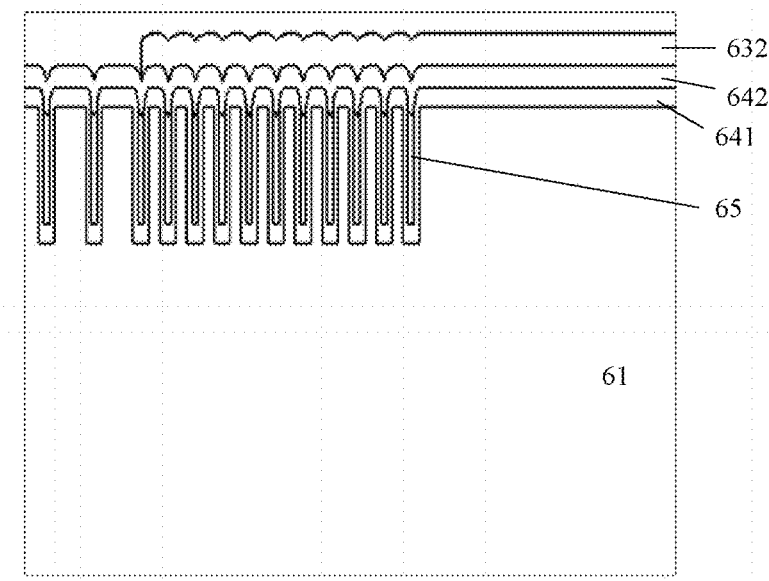
Figure 6:
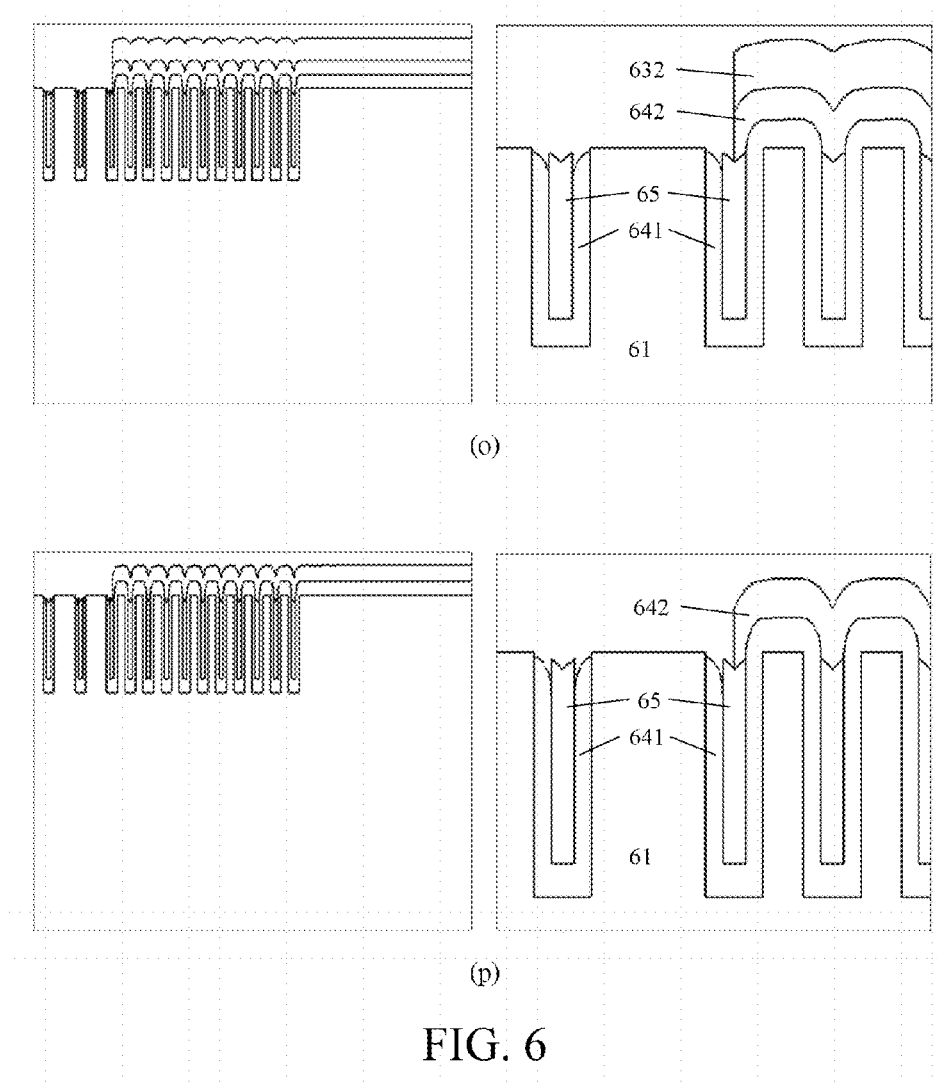
Figure 6:
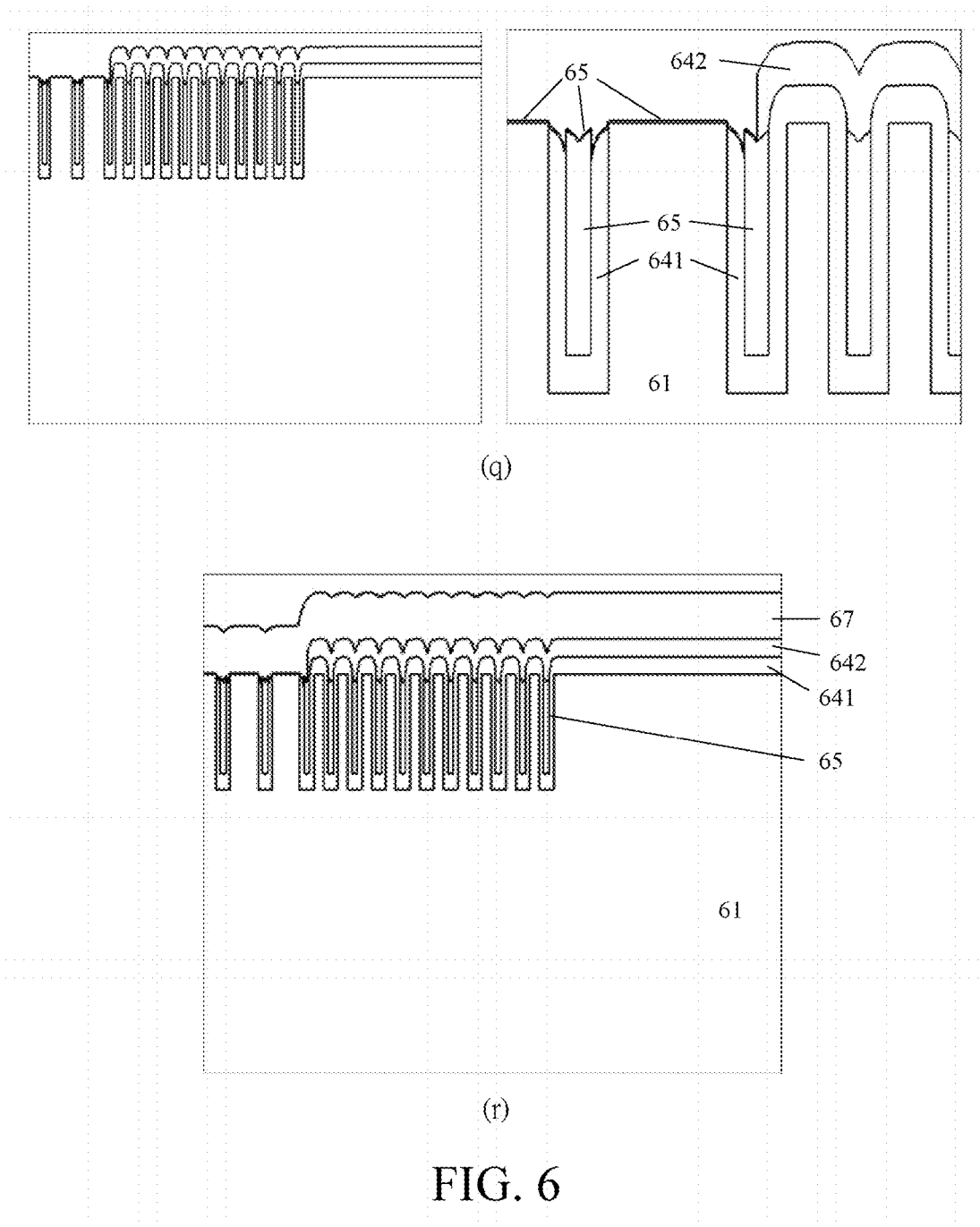
Figure 6:
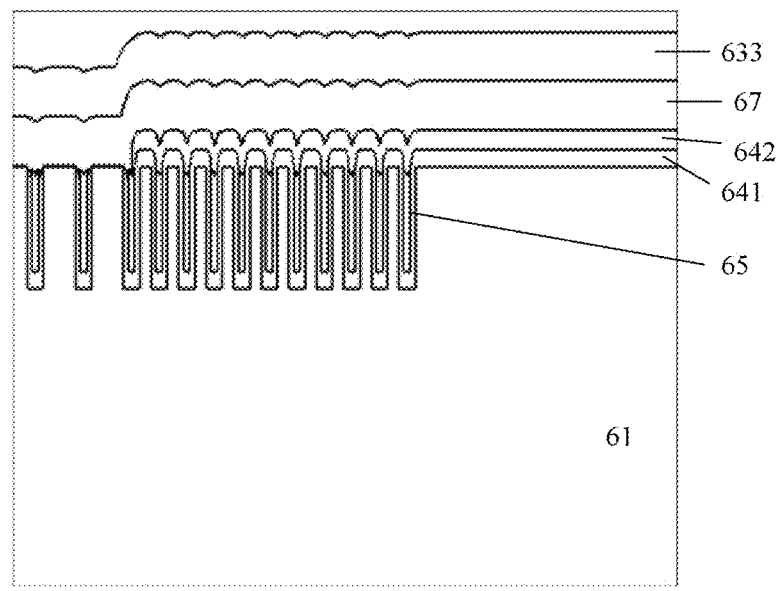
Figure 6:
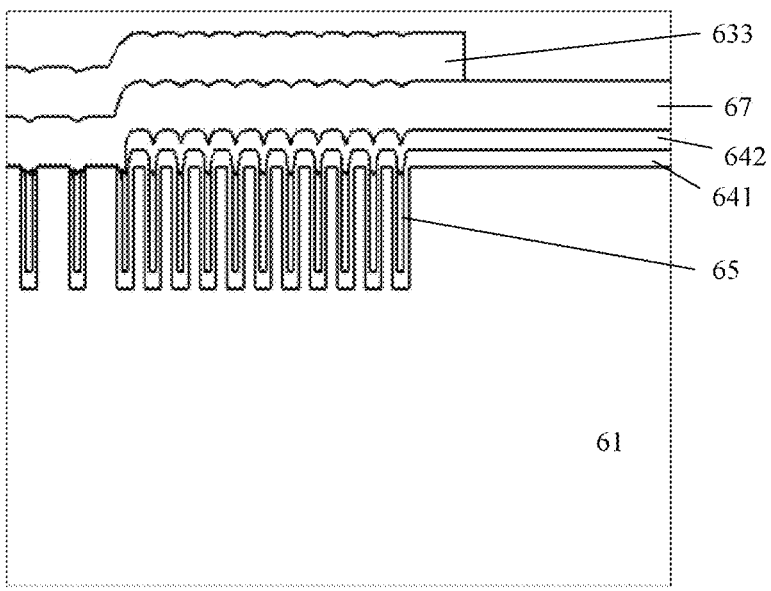
Figure 6:
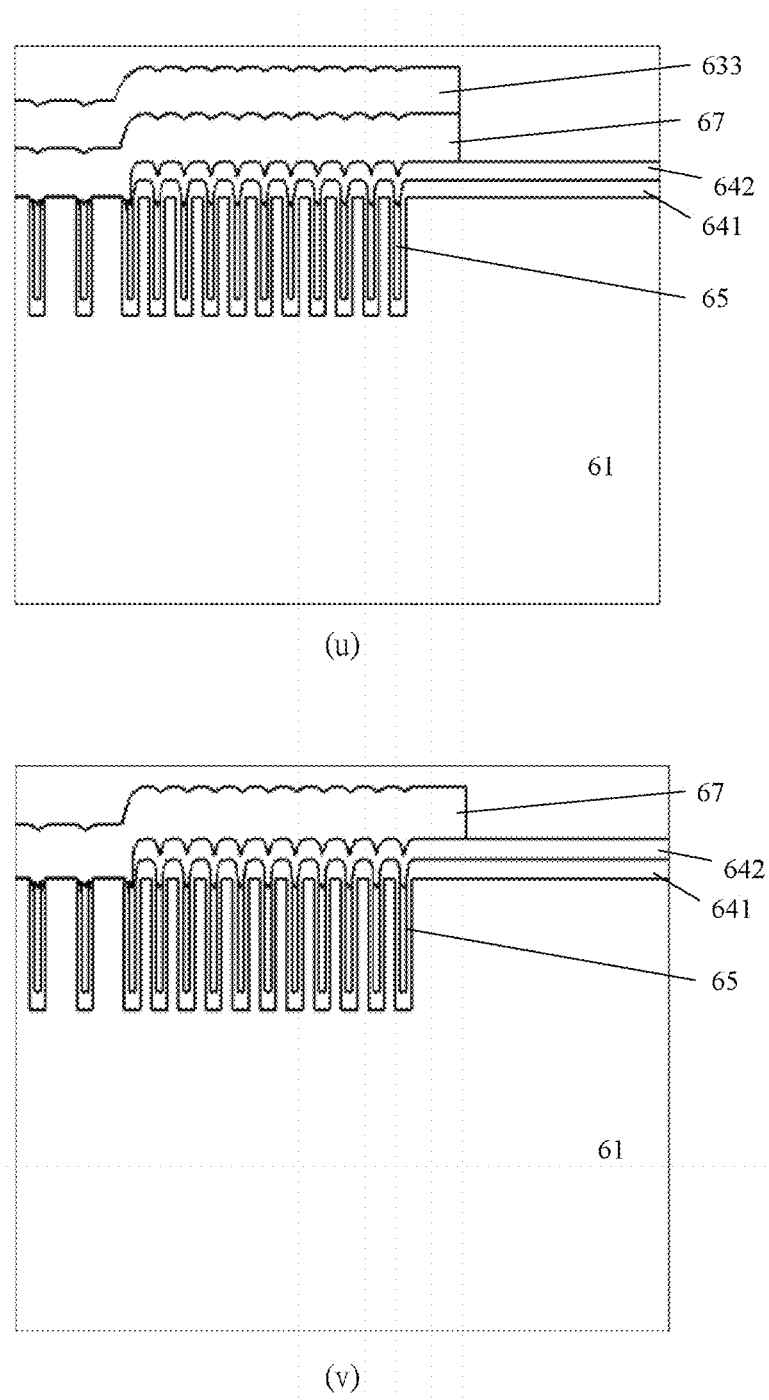
Figure 6:
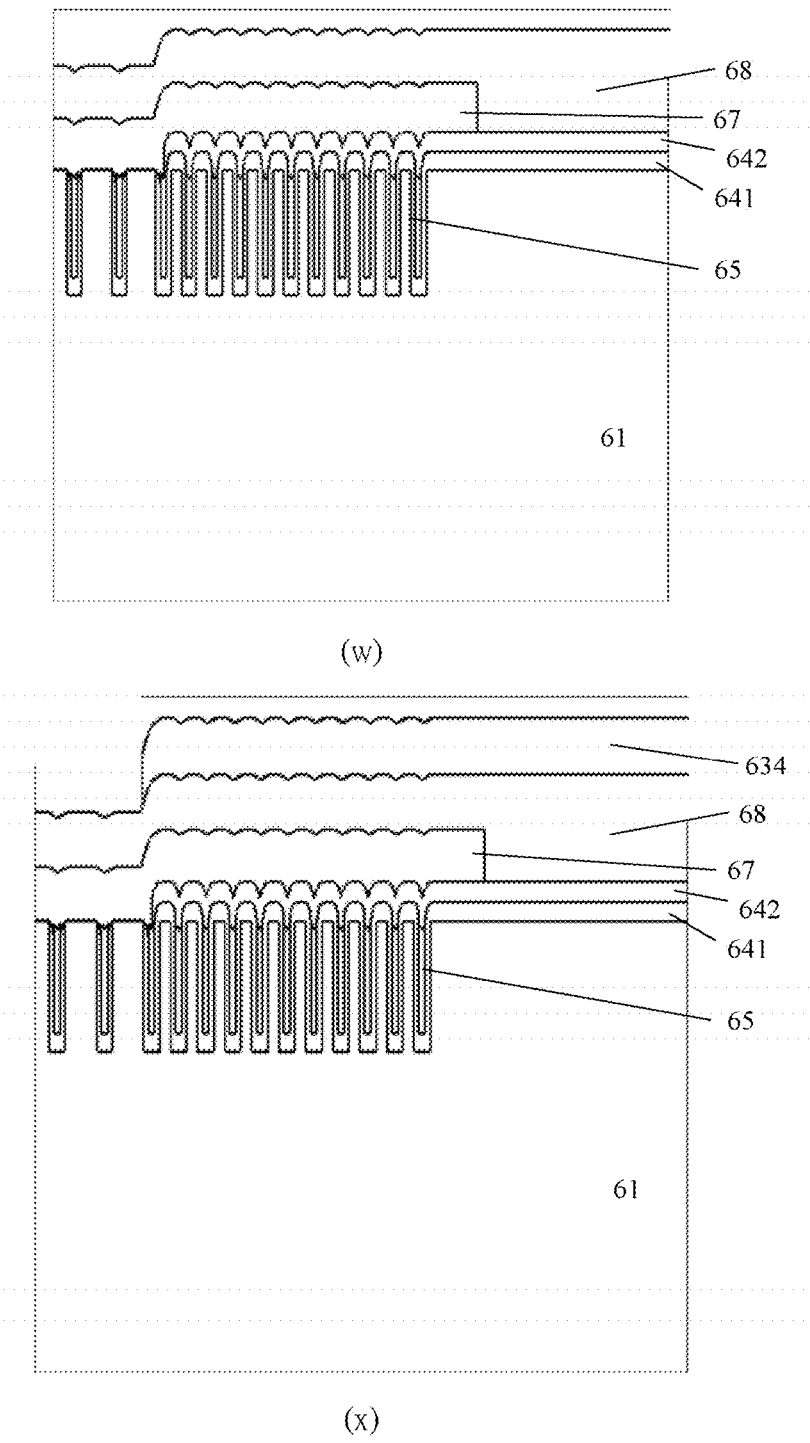
Figure 6:
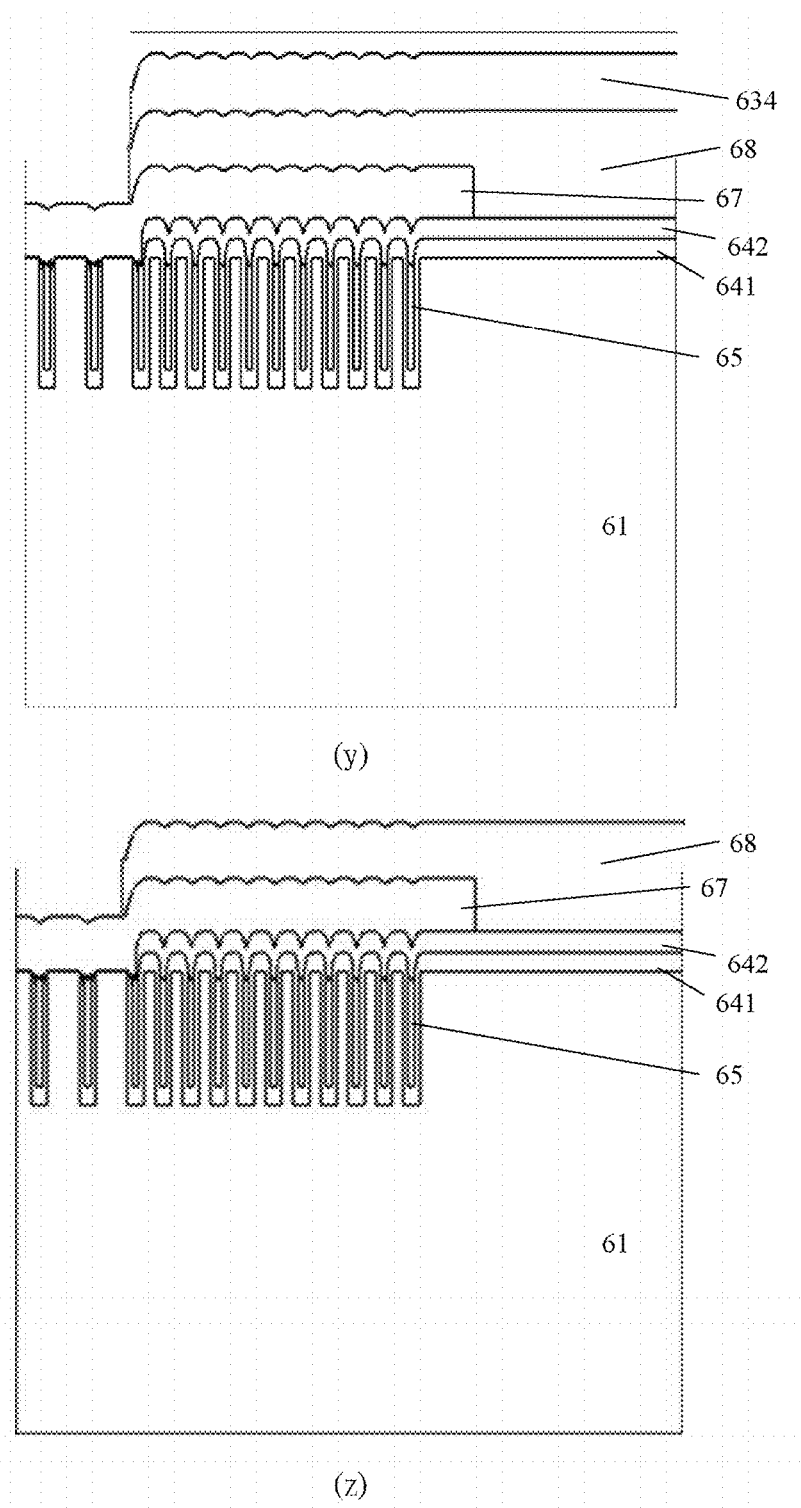

Another embodiment of the present invention is a Schottky diode structure, as shown in FIG. 3(a), the structure thereof may be divided into an active region 31 and a termination region 32, and includes a semiconductor layer 33 (which may be, for example, an epitaxial layer with a low doping concentration) and a plurality of trenches 34, and a junction between the active region 31 and the termination region 32 is located on a sidewall of a trench. Referring to FIGS. 3(b) and (c), this embodiment of the present invention includes a plurality of connecting trenches 351 and 352, formed on a surface of the semiconductor layer 33 and located in the termination region 32, for connecting two adjacent trenches in the plurality of trenches 34. The connecting trenches 351 in FIG. 3(b) correspond to the connecting trenches 211 in FIG. 2(b), and the connecting trenches 352 in FIG. 3(c) correspond to the connecting trenches 212 in FIG. 2(b). A first insulating layer 361 is formed on at least part of surfaces of the plurality of trenches 34 and the plurality of connecting trenches 351 and 352, and the surface of the semiconductor layer 33 where no trenches are formed in the termination region 32. Please refer to FIG. 6(p) for description about the "part of surfaces" herein, which refers to that in the trenches of the active region, a top edge of a first insulating layer 641 is lower than the original surface of an epitaxial layer 61 where no trenches are formed; in other words, the first insulating layer 641 does not completely cover all surfaces of each trench. However, this feature is only illustrative of the present invention, which may change according to component structures and process characteristics, and it is possible that the first insulating layer 641 completely covers all the surfaces of each trench. A conductive material 37 is formed in the plurality of trenches 34 and the plurality of connecting trenches 351 and 352, and the conductive material in two adjacent trenches may be connected through the conductive material 37 filled in the plurality of connecting trenches 351 and 352. Referring to FIG. 6(p) again, polysilicon 65 fills an inner space of the first insulating layer 641 in the trenches. In the prior art, whether the conductive material fills the trenches may change according to component structures and process characteristics. For example, when the trench width (relative to the depth) is greater, the conductive material may not fill the inner space of the first insulating layer, that is, the recess degree in the center of the conductive material is too large, so that the conductive material does not completely cover the first insulating layer in the bottom of the trench. However, based on the gist of the present invention, if the conductive material does not completely cover the first insulating layer in the bottom of the trench, it may result in that the conductive material in the same trench is not connected, and the connecting trench cannot connect two adjacent trenches. In addition, in the termination region 32, a second insulating layer 362 covers a surface of an upper edge of the first insulating layer 361 and a surface of an upper edge of the conductive material 37. In the active region 31, a metal silicide layer is formed on a surface of an upper edge of the semiconductor layer 33 and the surface of the upper edge of the conductive material 37, which may also be formed on an exposed surface of the first insulating layer 361 not contacting the semiconductor layer 33 and the conductive material 37 (not shown in FIGS. 3(a)-(c) due to a small scale, and please refer to the reference numeral 65 in FIG. 6(q)). A metal layer 38 covers a surface of the metal silicide layer and part of a surface of the second insulating layer 362, and the outermost layer may be covered by a protective layer 39.

In the structures disclosed in FIGS. 3(a)-(c), FIG. 6(q) and the previous description, the metal silicide layer is used for forming a Schottky barrier, which may also be replaced with a Schottky metal layer, and the material thereof may be, for example, aluminum or molybdenum; and the function of the metal layer 38 is serving as a contact electrode. However, this is only illustrative of the present invention about the Schottky barrier, and if an appropriate material (for example, aluminum) is used, the metal layer 38 may serve as an electrode and form the Schottky barrier at the same time. At this time, the active region does not need the metal silicide layer or the Schottky metal layer, and the metal layer 38 may be directly formed on a surface of the conductive material not contacting the first insulating layer, a surface of the first insulating layer not contacting the conductive material, and the surface of the semiconductor layer where the trenches or the connecting trenches are not formed.

Furthermore, in the embodiment of the present invention as shown in FIGS. 3(a)-(c), the trench adjacent to the innermost side of the termination region in the active region is the trench 34a, that is, the conductive material 37 of the trenches in the active region is electrically connected to the conductive material 37 in the trench 34a of the termination region through the metal layer 38, and the trench 34a is electrically connected to trenches 34b and 34c through the connecting trenches 351 and 352, so that a potential of the conductive material in the trench 34a and potentials of the conductive materials in the trenches 34b and 34c are the same. On the contrary, the trenches except the trenches 34a, 34b and 34c are not connected in the termination region structure shown in FIGS. 3(a)-(c), and the conductive material 37 therein still has a floating potential.

Figure 4:
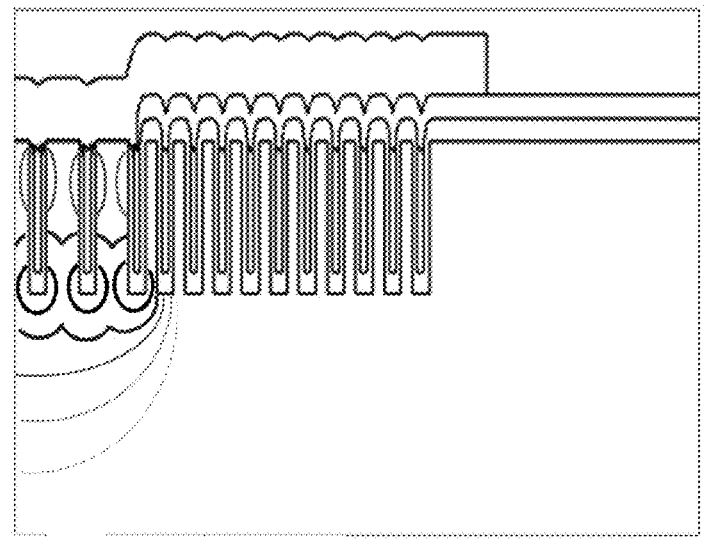
FIG. 4(a) is a schematic view of electric field distribution of a conventional Schottky diode.
FIG. 4(b) is a schematic view of electric field distribution of a Schottky diode according to the present invention.
Figure 4:
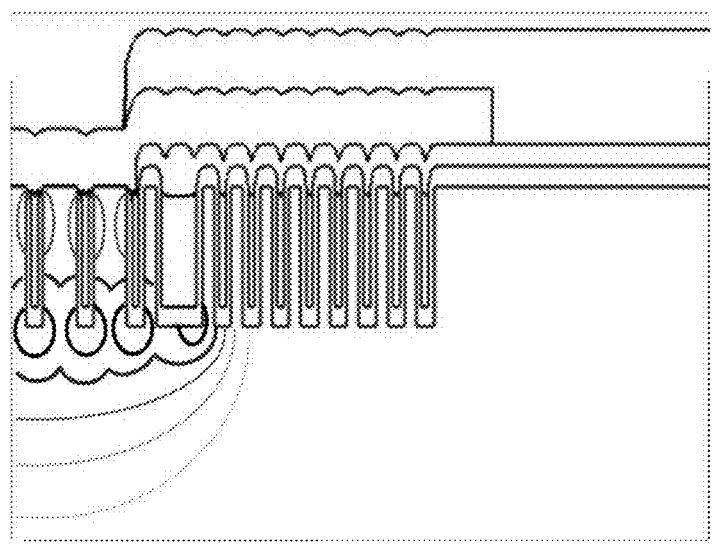
Figure 5:
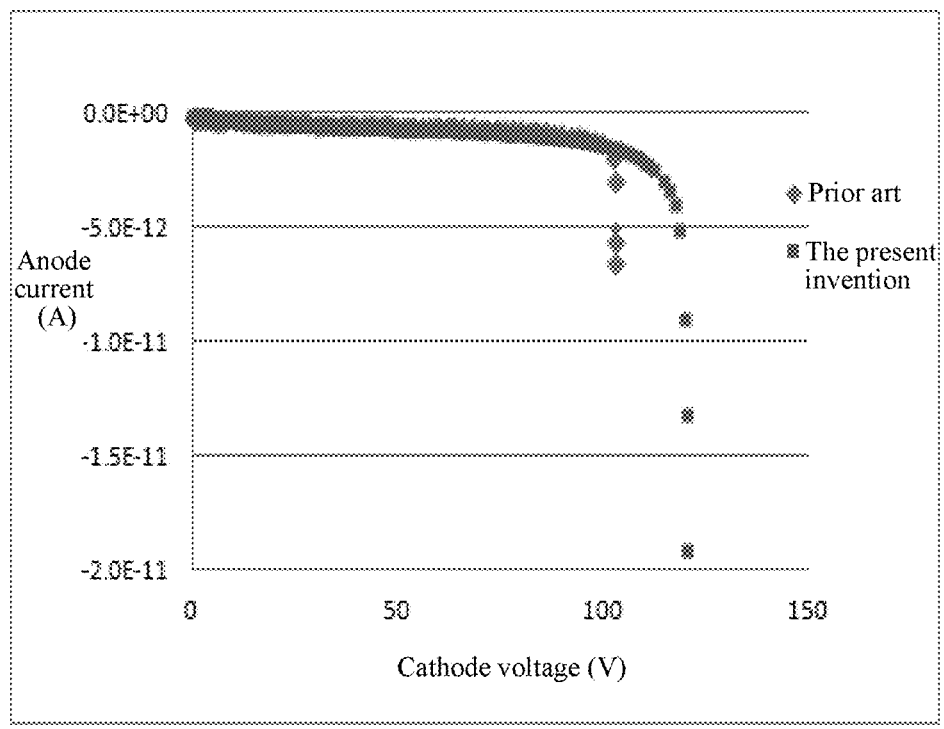
FIG. 5 is a schematic view of comparison between current-voltage curves of a Schottky diode according to the present invention and the conventional Schottky diode.

The Schottky diode structure proposed in the present invention is capable of changing electric field distribution in the components through arrangement of connecting trenches, which has effects of improving electrical performance. FIGS. 4(a) and (b) disclose electric field distribution of the conventional trench Schottky diode and a Schottky diode according to the present invention, from which their differences may be seen. FIG. 4(a) corresponds to the structure of the conventional trench Schottky diode, and FIG. 4(b) illustrates a structure that three trenches adjacent to the active region in the termination region are connected based on the gist of the present invention. It is apparent from comparison between FIG. 4(a) and FIG. 4(b) that, the electric field distribution of the conventional structure is more concentrated, and use of the structure according to the present invention may extend the electric field distribution outwards, so that the electric field may not be excessively concentrated in the active region. The more concentrated the electric field intensity is, the easier the result of voltage collapse or breakdown is produced. Therefore, the structure according to the present invention may have higher pressure resistance, that is, it has a higher breakdown voltage in the case of a reverse bias. According to the above description, FIG. 5 illustrates simulation comparison between voltage-current curves of the conventional trench Schottky diode and a Schottky diode according to the present invention. It can be seen from FIG. 5 that the Schottky diode according to the present invention indeed has a significantly improved breakdown voltage. The gist of the present invention lies in connecting one or more parts of trenches in a traditional trench-type semiconductor device, thereby dispersing electric field intensity of the active region; however, this feature is not limited to the trench Schottky diode, and may also be applied to other semiconductor devices having the similar principle and structure, such as, diodes or transistors.

Still another embodiment of the present invention is a method for manufacturing a Schottky diode. Structures formed in respective steps are shown in FIGS. 6(a)-(z), and description is given below in sequence. FIGS. 6(a)-(z) are cross-sectional views, of which the position is identical to FIG. 3(a) (along the segment A-A' in FIG. 2(b)), and thus the cross-sectional structures of the connecting trenches 351 and 352 are not presented as in FIG. 3(b) or (c). However, persons of ordinary skill in the art can fully understand and implement the following content through the top views of the trench structure in FIGS. 2(a)-(d).

As shown in FIG. 6(a), first, an epitaxial layer 61 with a lower doping concentration is formed on a silicon substrate (not shown) with a higher doping concentration, the material of the epitaxial layer 61 may be, for example, N-type monocrystalline silicon, and the thickness of the epitaxial layer 61 should be available for forming a trench structure in a subsequent step, for example, about 1-60 μm.

As shown in FIG. 6(b), a hard mask layer 62 is formed on the epitaxial layer 61. The material of the hard mask layer 62 may be, for example, $SiO_2$, and a manufacturing process thereof may adopt, for example, thermal oxidation or chemical vapor deposition. The main function of the hard mask layer 62 is shielding non-trench regions in subsequent etching of a trench, and therefore, its thickness depends on the etch depth required for the trench and the etch rate ratio of two different materials, the epitaxial layer 61 and the hard mask layer 62, during etching.

In order to make the hard mask layer 62 form a required pattern, FIGS. 6(c)-(f) illustrate a process of using photo lithography and dry etch, but available processes are not limited thereto. Firstly, a photo resist layer 631 is coated on the hard mask layer 62 (FIG. 6(c)). Secondly, part of the photo resist layer 631 is removed through exposure, development and other steps to form the required pattern (FIG. 6(d)); then, etching is performed, for example, dry etch may be adopted, to form substantially the same pattern on the hard mask layer 62 according to the pattern of the photo resist layer 631 (FIG. 6(e)). After the remaining photo resist layer 631 is removed, the patterned hard mask layer 62 shown in FIG. 6(f) may be obtained. With reference to the foregoing description, the Schottky diode structure according to the present invention has a plurality of connecting trenches, and thus in the exposure step of forming the structure in FIG. 6(d), the photo mask pattern used in the trench portion of the termination region may be as those shown in FIGS. 2(a)-(d). By use of positive photo resist as an example, the trench structure in FIGS. 2(a)-(d) is the transparent portion in a photo mask.

The pattern of the hard mask layer 62 is used for forming a trench structure on the epitaxial layer 61, as shown in FIG. 6(g). The etching process used herein may be, for example, dry etch with a better anisotropic effect. After trenches are formed on a surface of the epitaxial layer 61 not covered by the hard mask layer 62, the remaining hard mask layer 62 is removed, and the epitaxial layer 61 having a trench structure as shown in FIG. 6(h) may be obtained. In general, the depth of the trench structure may be, for example, about 0.5-30 μm.

After the trenches are formed on the epitaxial layer 61, a first insulating layer 641 may be formed on the epitaxial layer 61 in a manner such as, but not limited to, thermal oxidation or chemical vapor deposition. As shown in FIG. 6(i), the first insulating layer 641 completely covers surfaces of the trenches of the epitaxial layer 61 and the original surface where no trenches are formed, the thickness thereof may be, for example, 0.08-1 μm. In contrast to the prior art, to form the first insulating layer 641 in this step is equivalent to form simultaneously the gate oxide layer 43 and the first mask layer A1 in FIG. 1(a).

After the first insulating layer 641 is formed, polysilicon is formed in the trenches; the material that can be used herein is not limited to polysilicon, and tungsten or other conductive materials may also be used. FIG. 6(j) illustrates that polysilicon 65 is formed on the first insulating layer 641 through chemical vapor deposition, and by means of characteristics of the chemical vapor deposition, the polysilicon 65 may fill the trenches and form a film layer with a certain thickness above the whole substrate. The thickness of the film layer above generally depends on the width of the trenches, and the wider the trenches are, the thicker the film layer required above the polysilicon 65 is. Secondly, the polysilicon 65 above the substrate is etched back through dry etch, and the polysilicon film layer above is removed to expose a surface of an upper edge (that is, part of a surface not in the trench) of the first insulating layer 641, as shown in FIG. 6(k). The filling degree of the polysilicon 65 in the trenches depends on different processes and structure designs, and FIG. 6(k) is equivalent to filling polysilicon into a space surrounded by the first insulating layer. As stated previously, the present invention uses a connecting trench to connect two adjacent trenches in a termination region. If the trenches are too wide or too shallow, the etching back step may completely remove the polysilicon in the central portion, resulting in that the first insulating layer in the bottom of the trench is exposed; meanwhile, the polysilicon in the same trench is not completely connected, and a connecting trench cannot completely connect two adjacent trenches accordingly. Therefore, on the basis of the gist of the present invention, the etching back step herein must keep the polysilicon at least filling the bottom of the trenches, i.e. completely covering the first insulating layer in the bottom of the trenches.

After the processing through the foregoing steps, a second insulating layer 642 is continuously formed on the substrate, for example, a silicon dioxide layer may be formed through chemical vapor deposition, as shown in FIG. 6(l).

FIGS. 6(m)-(p) illustrate steps of removing part of the first insulating layer 641 and the second insulating layer 642, for forming an opening of the active region. Firstly, a photo resist layer 632 is coated on the second insulating layer 642 (FIG. 6(m)), and after exposure, development and other steps, the photo resist layer 632 in an opening region is removed (FIG. 6(n)). Secondly, the non-removed photo resist layer 632 is used as a shield to remove the first insulating layer 641 and the second insulating layer 642 in the opening portion through etching (FIG. 6(o)). For example, dry etch or other etching manners may be adopted. In addition, FIG. 6(o) also discloses that part of the first insulating layer 641 in the trenches is not removed, and thus the first insulating layer 641 in the trenches of the active region has the function of the gate oxide layer. After the photo resist layer 632 is removed, the sectional structure is as that shown in FIG. 6(p).

Upon completion of the structure of FIG. 6(p), in a next step, a metal silicide layer 66 is formed in a component active region, as shown in FIG. 6(q). Firstly, a metal layer is formed in the active region. For example, a nickel or titanium film may be formed through evaporation or sputtering. The metal reacts with the surface of the epitaxial layer 61 (a portion where no trenches are formed) and a surface of an upper edge of the polysilicon 65 in the trench through a thermal annealing process, so as to form the metal silicide layer 66 at a junction, and a junction between the metal silicide layer 66 and the epitaxial layer 61 forms the Schottky barrier. However, in an actual manufacturing process, the metal silicide layer may also be formed on a surface of the first insulating layer 641 not contacting the polysilicon 65 or the epitaxial layer 61. As stated previously, the metal silicide layer 66 may also be replaced with a Schottky metal layer, for example, an aluminum film or a molybdenum film may be formed to at least cover the active region. In addition, this step may also be omitted, and the Schottky barrier is formed directly with a junction between the metal layer 67 and the epitaxial layer 61 in subsequent steps.

FIGS. 6(r)-(v) illustrate steps of forming a metal electrode structure. Firstly, a metal layer 67 is deposited on a surface of the entire component (FIG. 6(r)), and then a photo resist layer 633 is coated (FIG. 6(s)). Secondly, peripheral portions of the photo resist layer 633 are removed in manners such as exposure and development, so that the non-removed photo resist layer 633 covers the active region and the termination region (FIG. 6(t)); then, the metal layer 67 is etched under shield of photo resist, that is, the metal layer 67 beyond the component region is removed (FIG. 6(u)). Finally, the remaining photo resist layer 633 is removed (FIG. 6(v)). The metal layer 67, if manufactured with an appropriate material (for example, aluminum), may serve as an electrode and form a Schottky barrier at the same time, and thus the metal silicide layer or Schottky metal layer may be omitted.

Finally, FIGS. 6(w)-(z) illustrate steps of forming a protective layer structure. Firstly, a protective layer 68 is deposited on the surface of the entire component (FIG. 6(w)). For example, silicon dioxide or silicon nitride may be used as a material of the protective layer 68. Next, a photo resist layer 634 is coated, and an opening is formed above the active region in manners such as exposure and development (FIG. 6(x)); then, the protective layer 68 is etched, and the portion above the active region of the protective layer 68, which is not covered by photo resist, is removed to expose the electrode to serve as ohmic contact (FIG. 6(y)). Finally, the remaining photo resist layer 634 is removed (FIG. 6(z)). Therefore, a basic structure of a semiconductor device according to an embodiment of the present invention is completed.

The embodiments described above are only exemplary for the present invention rather than all possible variations thereof. The scope claimed by the applicant is as defined by the following claims, of which literal meanings and equivalents are all included in the scope of the claims, and the content of the description or drawings should not be construed as limitations of the claims.

DESCRIPTION OF REFERENCE NUMERALS

11 Multi-trench structure
12 Semiconductor substrate
13 First mask layer
14 Gate oxide layer
15 Polysilicon structure
16 Second mask layer
17 Metal sputtering layer
31 Active region
32 Termination region
33 Semiconductor layer
37 Conductive material
38, 67 Metal layer
39, 68 Protective layer
61 Epitaxial layer
62 Hard mask layer
65 Polysilicon
66 Metal silicide layer (Schottky metal layer)
211-216, 351, 352 Connecting trench
221-223, 34, 34a, 34b, 34c Trench
361, 641 First insulating layer
362, 642 Second insulating layer
631, 632, 633, 634 Photo resist layer

What is claimed is:

1. A Schottky diode, having an active region and a termination region, comprising:
    a semiconductor layer;
    a plurality of trenches, formed on a surface of the semiconductor layer;
    a connecting trench, formed on the surface of the semiconductor layer and located in the termination region, for connecting a first trench and a second trench adjacent to each other in the plurality of trenches;
    a first insulating layer, formed on at least part of a surface of the plurality of trenches, at least part of a surface of the connecting trench, and the surface of the semiconductor layer where the plurality of trenches or the connecting trench is not formed in the termination region;
    a conductive material, formed in the plurality of trenches and the connecting trench whose surfaces have the first insulating layer, wherein the conductive material in the first trench and the conductive material in the second trench are connected through the conductive material in the connecting trench;
    a second insulating layer, at least covering part of a surface of the first insulating layer not contacting the conductive material and part of a surface of the conductive material not contacting the first insulating layer in the termination region; and
    a metal layer, at least covering the active region and part of a surface of the second insulating layer.

2. The Schottky diode according to claim 1, wherein in the first trench, the second insulating layer covers part of the surface of the conductive material not contacting the first insulating layer, and the metal layer covers the other part of the surface of the conductive material not contacting the first insulating layer.

3. The Schottky diode according to claim 1, wherein the conductive material is polysilicon or tungsten.

4. The Schottky diode according to claim 1, further comprising a metal silicide layer or a Schottky metal layer, at least formed on surfaces of the semiconductor layer and the conductive material not contacting the first insulating layer in the active region.

* * * * *